(12) United States Patent
White

(10) Patent No.: US 9,517,504 B2
(45) Date of Patent: Dec. 13, 2016

(54) ARTICLE WITH GROUPED GRAIN PATTERNS

(71) Applicant: UNITED TECHNOLOGIES CORPORATION, Hartford, CT (US)

(72) Inventor: Mark White, West Palm Beach, FL (US)

(73) Assignee: United Technologies Corporation, Farmington, CT (US)

( * ) Notice: Subject to any disclaimer, the term of this patent is extended or adjusted under 35 U.S.C. 154(b) by 36 days.

(21) Appl. No.: 14/499,367

(22) Filed: Sep. 29, 2014

(65) Prior Publication Data

US 2015/0013934 A1 Jan. 15, 2015

Related U.S. Application Data

(62) Division of application No. 13/559,829, filed on Jul. 27, 2012, now abandoned.

(51) Int. Cl.
| | | |
|---|---|---|
| *B22C 9/04* | (2006.01) | |
| *B22C 9/12* | (2006.01) | |
| *B22D 25/06* | (2006.01) | |
| *B22D 27/04* | (2006.01) | |
| *B22C 19/04* | (2006.01) | |
| *B32B 15/01* | (2006.01) | |
| *C30B 21/02* | (2006.01) | |

(52) U.S. Cl.
CPC ............... *B22D 25/06* (2013.01); *B22C 9/04* (2013.01); *B22C 9/12* (2013.01); *B22C 19/04* (2013.01); *B22D 27/045* (2013.01); *B32B 15/01* (2013.01); *C30B 21/02* (2013.01); *Y10T 428/12639* (2015.01)

(58) Field of Classification Search
CPC ............. B22C 9/04; B22C 9/12; B22D 25/06; B22D 27/045
USPC .......................................... 164/520, 47, 122
See application file for complete search history.

(56) References Cited

U.S. PATENT DOCUMENTS

| | | | |
|---|---|---|---|
| 4,436,485 A | 3/1984 | Vonnegut | |
| 4,655,276 A * | 4/1987 | Bird et al. .............. | B22C 1/165 164/15 |
| 4,813,470 A | 3/1989 | Chiang | |
| 5,335,711 A * | 8/1994 | Paine ...................... | B22D 27/13 164/120 |
| 2004/0167270 A1* | 8/2004 | Chang ....................... | B22C 7/02 524/487 |
| 2013/0171020 A1* | 7/2013 | Bullied ..................... | B22C 9/06 420/591 |

* cited by examiner

*Primary Examiner* — Kevin P Kerns
(74) *Attorney, Agent, or Firm* — Bachman & LaPointe, P.C.

(57) ABSTRACT

A method for forming an article includes providing a mold and casting a metal material within the mold so that a part is produced which has a first portion having a first grain pattern and a second portion having a second grain pattern different from said first grain pattern.

8 Claims, 2 Drawing Sheets

ARTICLE WITH GROUPED GRAIN PATTERNS

CROSS REFERENCE TO RELATED APPLICATION(S)

This application is a divisional application of abandoned U.S. patent application Ser. No. 13/559,829, filed Jul. 27, 2012, entitled "Article With Grouped Grain Patterns".

The present disclosure relates to an article having a grouped grain structure and to a method for forming such an article.

It is known that cast articles can be formed with different grain patterns. For example, it is known how to form an equiaxed structure where there are randomly solidified and distributed grains with a significant number of low-angle grain boundaries. It is also known how to form a directionally solidified structure where fewer grains with high angle boundaries are solidified radially. Further, it is known how to form a single crystal grain structure in which one high angle grain is in the radial direction. The limitation of only one grain pattern in a single cast structure has limited the properties that are made use of when designing a structure.

SUMMARY

In accordance with the present disclosure, there is provided an article which broadly comprises a first portion having a first grain pattern and a second portion having a second grain pattern different from the first grain pattern.

In another and alternative embodiment, the first grain pattern is an equiaxed grain pattern.

In another and alternative embodiment, the first portion is a root attachment section.

In another and alternative embodiment, the second grain pattern is a directionally solidified pattern.

In another and alternative embodiment, the second portion is an airfoil portion.

In another and alternative embodiment, the article is a turbine engine blade.

In another and alternative embodiment, the article is a cast article.

Further in accordance with the present disclosure, there is provided a method for forming an article which broadly comprises providing a mold and casting a metal material within the mold so that a first portion has a first grain pattern and a second portion has a second grain pattern different from the first grain pattern.

In another and alternative embodiment, the method may further comprise forming the mold using a wax pattern and dipping the wax pattern into a ceramic material.

In another and alternative embodiment, the method may further comprise applying a cobalt containing material to a surface of said wax pattern prior to said dipping step.

In another and alternative embodiment, the cobalt containing material applying step comprises applying a material selected from the group consisting of 7% cobalt aluminate and cobalt oxide.

In another and alternative embodiment, the method may further comprise placing a shield around the mold.

In another and alternative embodiment, the shield placing step may comprise placing a shield which extends from a first region of the mold where a root attachment section will be formed to a second region of the mold where a platform will be formed.

In another and alternative embodiment, the method may further comprise providing a scepter and a controller for the scepter; programming the controller to have a grouped grain program profile; and powering the scepter after the metal material in molten form has been placed into the mold to form the part having the first grain pattern and the second grain pattern.

In another and alternative embodiment, the casting step may comprise forming said first grain pattern as an equiaxed grain pattern.

In another and alternative embodiment, the casting step may further comprise forming the equiaxed grain pattern in a root attachment section.

In another and alternative embodiment, the casting step may comprise forming the second grain pattern as a directionally solidified pattern.

In another and alternative embodiment, the casting step may further comprise forming the second pattern in an airfoil portion.

In another and alternative embodiment, a casting system for forming a part having a first portion with a first grain pattern and a second portion with a second grain pattern different from the first grain pattern, the casting system broadly comprises a mold having a length and a shield having a length less than the length of the mold.

In another and alternative embodiment, the casting system further comprises a scepter surrounding the mold and a controller for the scepter.

In another and alternative embodiment, the controller is programmed to have a grouped grain program profile.

Other details of the article with the grouped grain patterns and a method and a casting system for forming same are set forth in the following detailed description.

DETAILED DESCRIPTION

In accordance with the present disclosure, there is provided a method for forming an article or a part, such as a turbine engine component, in which a first portion has a first grain pattern and a second portion has a second grain pattern different from the first grain pattern. The turbine engine component may be a turbine blade or a vane.

Figure 1:
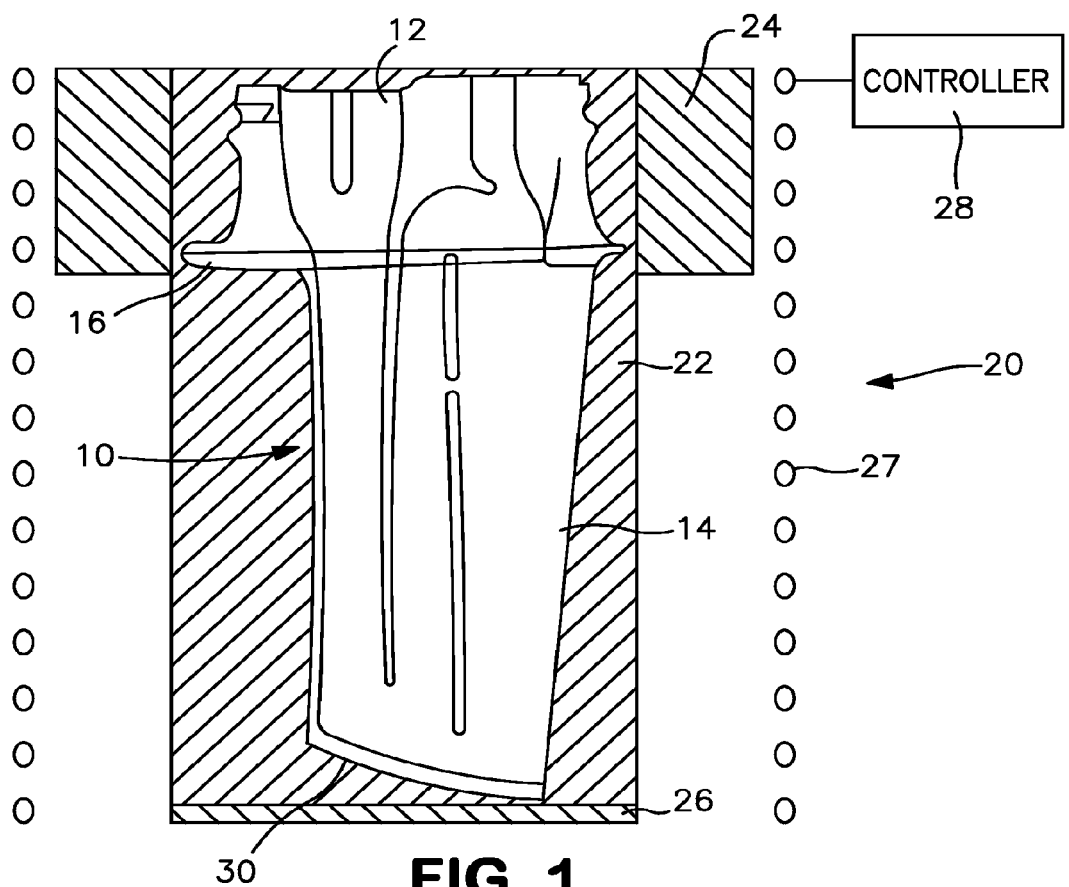
FIG. 1 is a schematic representation of a casting system for forming a turbine engine component.

In one exemplary embodiment, as shown in FIG. 1, a turbine engine blade 10 may be formed in a single casting technique. The turbine engine blade 10 may have an equiaxed grain pattern in a root attachment section 12 and a directionally solidified grain pattern in the airfoil portion 14. The turbine engine blade 10 may be provided with a platform 16. Such a cast structure can provide excellent transverse properties in the root attachment section 12 and excellent radial properties in the airfoil portion 14. Such a cast structure may fulfill more of the needed design characteristics for a turbine engine blade 10 which rotates.

Figure 2:
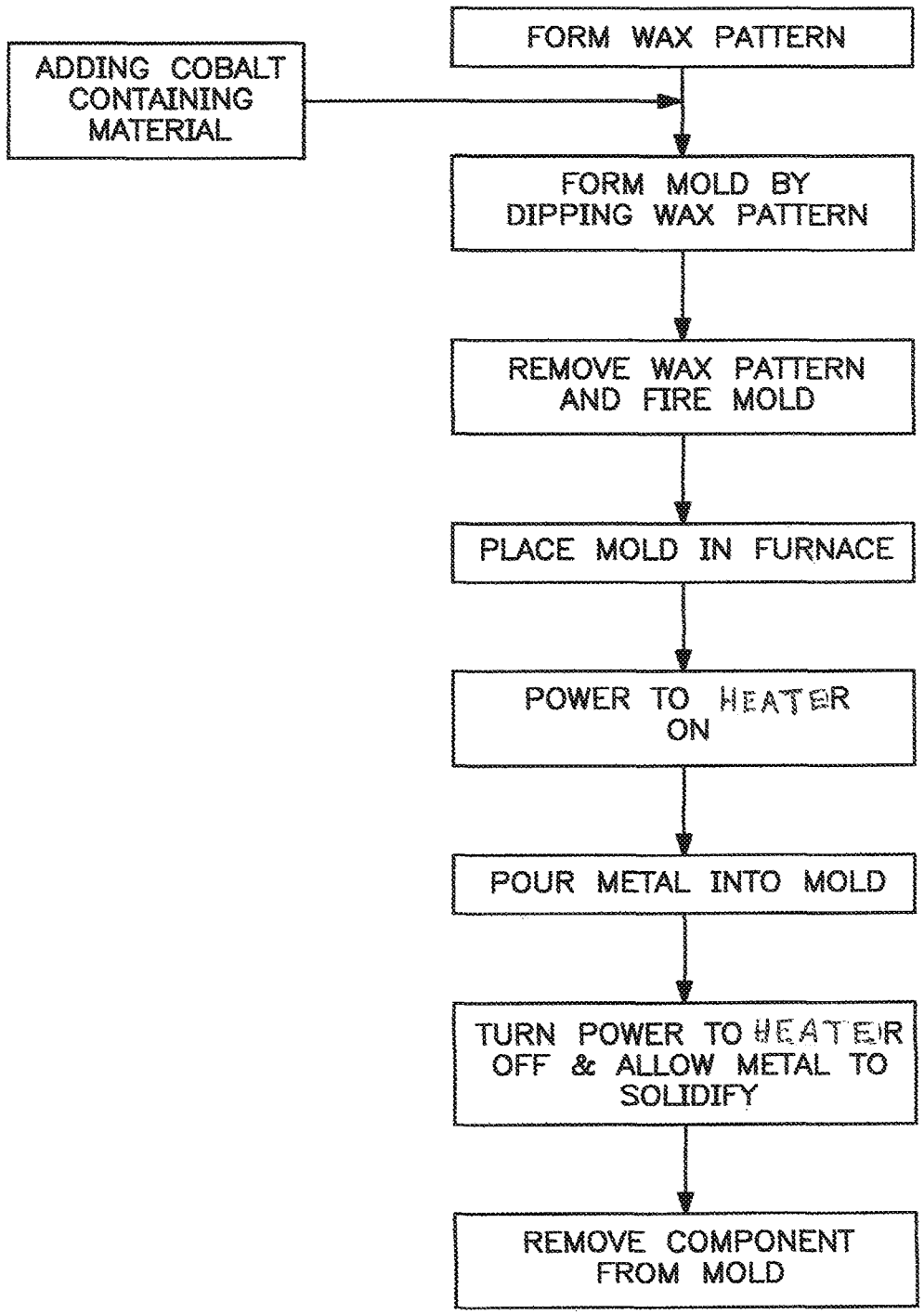
FIG. 2 is a flow chart of a method for forming a turbine engine component.

Referring now to FIG. 1, there is shown a casting system 20 for forming a turbine engine blade 10 having an equiaxed grain pattern in the root attachment section 12 and a directionally solidified grain pattern in the airfoil portion 14. The casting system 20 includes a mold 22 having a length. Referring now to FIG. 2, the mold 22 may be formed by forming a wax pattern. The mold 22 may be formed by dipping the wax pattern into a ceramic material. The mold 22 has the shape of the external portions of the turbine engine blade 10. Once the mold 22 has been formed, the wax pattern may be removed and the mold may be fired. Thereafter, the mold 22 may be placed within a furnace.

To form the component having an equiaxed grain pattern in the first section 12 of the component and a different grain pattern in a second section 14 of the component, a shield or baffling arrangement 24 may be used. The shield or baffling arrangement 24 may be used to confine the gradient or the different grain pattern to the area between a chill plate 26 and a platform 16 of the turbine engine component 10. The shield or baffling arrangement 24 has a length which is less than the length of the mold 22.

Figure 3:
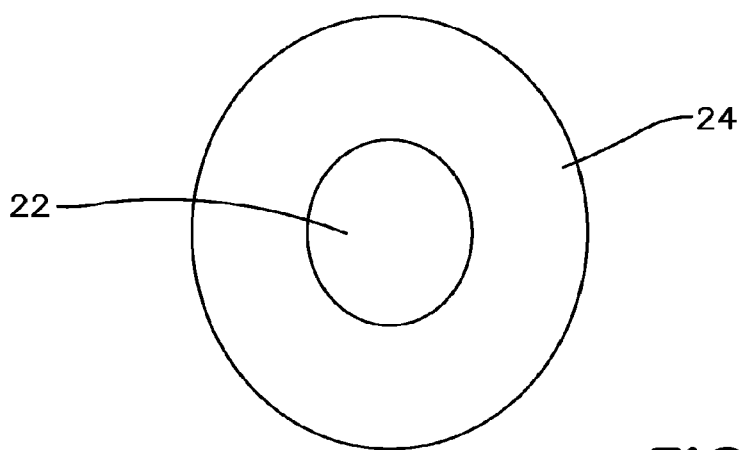
FIG. 3 is a schematic representation of a baffle or shielding arrangement used in the casting system of FIG. 1.

Referring now to FIG. 3, it can be seen that the shield or baffling arrangement 24 surrounds the mold 22. This shield or baffling arrangement 24 may be a round ceramic or graphite washer that is placed over the region of the mold 22 where the root attachment section 12 of the turbine engine component 10 is to be formed. The shield or baffling arrangement 24 may stop or be terminated in line with the region of the mold where a platform 16 of the turbine engine component 10 may be formed. The shield or baffling arrangement 24 may be something which is purchased or produced on site. The shield or baffling arrangement 24 may be placed on the mold 22, in the foundry, or at preparation of the mold 22. The shield or baffling arrangement 24 may be as simple as using a graphite washer at mold preparation or when the mold is placed into the scepter for pouring. One reason for using the shield or baffle arrangement 24 is that it should enhance proper grain structure in the final turbine engine component.

The molding system 20 further includes a scepter (aka. heater) 27 for heating the molten metal in the mold 22 to a desired temperature regime. When the scepter power is turned off there will be no heat source, radiant or otherwise, in the area of the root attachment section 12, thereby leaving that area of the casting to freeze off quickly as an equiaxed structure requires.

A controller 28 may be provided to control the power to the scepter 27. The controller 28 is known as a scepter power supply controller. The controller 28 is programmable and may have programmed into it a "grouped grain" program profile which is just like programming in any other standard DS or SX profile that is called up when it is time to run that specific job.

If desired, a cobalt containing material, such as 7% cobalt aluminate or cobalt oxide, may be added to the wax pattern on a surface in a region below where the platform 16 of the turbine engine component is to be formed. The cobalt containing material may help to provide equiaxed grain growth in that specific area. The cobalt containing material may be in a slurry form and may be a sample taken from the first prime of the equiaxed shell line. The cobalt containing material may be applied by hand painting, spraying or dipping prior to first prime.

After the controller 28 has been programmed and power to the scepter 27 has been turned on, molten metal may be poured into the mold 22. The mold metal may be one of many different metal alloys, preferably a nickel based or cobalt based metal alloy. Examples of metal alloys which may be used to form the turbine engine component 10 include IN 792 and all derivatives and similar alloy compositions including IN 792 Mod 5, IN 792 MOD, GTD-111. Alternatively, alloys that have similar constituents as IN 792 relative to grain boundary strengtheners may be used. Other alloys which are used as DS alloys may be used.

As can be seen from FIG. 1, the turbine engine component 10 may be formed with the tip 30 down.

Following the program used by the controller 28, the power to the scepter 27 is turned off at a programmed time. The metal in the mold 22 is then allowed to solidify. When solidified, the turbine engine component 10 may be removed from the mold 22.

While the present disclosure has shown how to form a turbine blade, it should be apparent that the system and method disclosed herein may be used to form a wide variety of turbine engine components, including vanes and blade outer air seals.

It should also be apparent that the system and method of the present disclosure may be used to form parts other than turbine engine components for which grouped grain patterns may be useful.

There has been provided in accordance with the present disclosure an article with grouped grain patterns. While the article has been described in the context of specific embodiments thereof, other unforeseen alternatives, modifications, and variations may become apparent to those skilled in the art having read the foregoing disclosure. Accordingly, it is intended to embrace those alternatives, modifications, and variations as fall within the broad scope of the appended claims.

What is claimed is:

1. A method for forming an article comprising:
providing a mold;
casting a metal material within said mold so that a part is produced which has a first portion having a first grain pattern and a second portion having a second grain pattern different from said first grain pattern;
forming said mold using a wax pattern and dipping the wax pattern into a ceramic material;
applying a cobalt containing material to a surface of said wax pattern prior to said dipping step, said cobalt containing material consisting of a 7% cobalt aluminate.

2. The method according to claim 1, further comprising placing a shield around said mold.

3. The method according to claim 2, wherein said placing step comprises placing a shield which extends from a first region of the mold where a root attachment section will be formed to a second region of the mold where a platform will be formed.

4. The method according to claim 2, further comprising:
providing a heater and a controller for said heater;
programming said controller to have a grouped grain program profile; and
powering said heater after said metal material in molten form has been placed into said mold to form said part having said first grain pattern and said second grain pattern.

5. The method of claim 1 wherein said casting step comprises forming said first grain pattern as an equiaxed grain pattern.

6. The method of claim 5, wherein said casting step further comprises forming said equiaxed grain pattern in a root attachment section.

7. The method of claim 5, wherein said casting step comprises forming said second grain pattern as a directionally solidified pattern.

8. The method of claim 7, wherein said casting step further comprises forming said second pattern in an airfoil portion.

* * * * *